(12) United States Patent
Hickman

(10) Patent No.: US 6,297,877 B1
(45) Date of Patent: *Oct. 2, 2001

(54) METHODS FOR COMPENSATING FOR LENS HEATING RESULTING FROM WAFER REFLECTANCE IN MICRO-PHOTOLITHOGRAPHY EQUIPMENT

(75) Inventor: Craig Hickman, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/133,384

(22) Filed: Aug. 13, 1998

(51) Int. Cl.$^7$ ............ G03B 27/42; G03B 27/52; G03B 27/32
(52) U.S. Cl. ................. 355/77; 355/53; 355/55
(58) Field of Search .............. 355/53, 53.5, 53.52, 355/55, 30, 44, 77, 133

(56) References Cited

U.S. PATENT DOCUMENTS

| | | | |
|---|---|---|---|
| 5,337,097 | * 8/1994 | Suzuki et al. | 353/101 |
| 5,581,324 | * 12/1996 | Miyai et al. | 355/53 |
| 5,591,958 | 1/1997 | Nishi et al. | 250/205 |
| 5,721,608 | * 2/1998 | Taniguchi | 355/53 |
| 5,953,106 | * 9/1999 | Unno et al. | 355/55 |

FOREIGN PATENT DOCUMENTS 5-335209  12/1993 (JP) .

* cited by examiner

Primary Examiner—Russell Adams
Assistant Examiner—Rodney Fuller
(74) Attorney, Agent, or Firm—Dorsey & Whitney LLP

(57) ABSTRACT

Methods for determining a correction factor for a focus of a lens used to process semiconductor wafers. The correction factor corresponds to the reflectance of a wafer that is within the focus field of the lens. A reflectance of a first wafer is measured, the first wafer being in a first condition, typically having only a substrate and a layer of bleached resist. A reflectance of a second wafer is measured, the second wafer being in a processed condition coated with a layer of bleached resist. The focus correction factor is calculated corresponding to the first and second reflectances.

55 Claims, 4 Drawing Sheets

METHODS FOR COMPENSATING FOR LENS HEATING RESULTING FROM WAFER REFLECTANCE IN MICRO-PHOTOLITHOGRAPHY EQUIPMENT

TECHNICAL FIELD

This invention relates generally to semiconductor photolithography, and more particularly, to methods for determining a more accurate focus of a lens used in semiconductor photolithography.

BACKGROUND OF THE INVENTION

The processing of semiconductor wafers can use microphotolithography to imprint patterns of light onto a light sensitive photoresist. Depending on the type of photoresist, either that portion of the photoresist that was exposed to light, or that portion of the photoresist that was not exposed to light is then removed, leaving either a positive or negative image of the pattern. The photoresist may then be used as a mask for the deposition or removal of material used to form the components and interconnections of a circuit on the wafer. This photolithography process is repeated many times with additional patterns and masks during fabrication of integrated circuits on the wafer.

Maintaining an accurate focus of the pattern of light on the wafer is particularly important in the above process. The size of features on a typical semiconductor wafer are sufficiently small that a minimal change in the focus can blur a pattern sufficiently to cause separate portions of the pattern imprinted on the wafer to overlap. In such case, material will be improperly deposited or removed on areas of the wafer.

The pattern of light is typically focused onto the wafer using a device known as a "stepper." One such stepper is manufactured by ASML. The stepper contains a set of lenses (hereinafter referred to simply as ("a lens") that is used to focus the pattern of light onto the wafer. The light passing through the lens heats the lens, thereby expanding the lens and changing its focal length. Thus, even if the image is precisely focused at the start of an exposure, it will subsequently be out of focus.

The amount of expansion of the lens, and therefore the change in focus, will vary depending on factors such as the intensity of the light, the reflectance of the wafer, the duration that the light is on the lens, as well as other factors.

FIG. 1 is a graph of the actual change in focus of the lens in a stepper machine manufactured by ASML as a function of time as the lens heats up. Those skilled in the art will be familiar with stepper machines, including the ASML stepper, and further discussion is therefore omitted, in the interest of brevity. As seen in FIG. 1, over a period of approximately half an hour (typically the time used to process 25 wafers) the focus of the lens in the stepper changes by approximately 0.4 microns. This change is significant given that typically an entire depth of field for the focus may be only 0.4 microns. The heating, and therefore the expansion of the lens, is not constant due to brief cooling periods while a processed wafer is removed and an unprocessed wafer is inserted under the lens. During these times no light is being applied to the lens. These cooling periods can be seen periodically in FIG. 1 by the slight decreases in the focus signal.

FIG. 2 is a graph of a formula used to compensate for lens heating in an ASML stepper. Rather than measuring the change in focus after each wafer is processed and correcting for that change in focus, the ASML stepper uses the estimate of the change in focus shown in FIG. 2 to alter the focus of the lens as the lens heats up during a series of exposures. For example, if the focal length of a lens increases by 0.4 microns over a period of 30 minutes, the stepper can be programmed to decrease the focus of the stepper by 0.4 microns over this 30 minute period.

The estimated change in focus shown in FIG. 2 is given by the mathematical formula $F(inf)=[(u_1 \times T \times S \times Q) \times (1-\exp(-t/\tau_1)) + (u_2 \times T \times S \times Q) \times (1-\exp(-t/\tau_2))]$ (Equation 1), where $F(inf)$ is the focus of the lens, $u_1$ is a first scaling machine constant, $u_2$ is a second scaling machine constant, T is a transmission value of a reticle in the stepper, S is a field size of the image (i.e., how much of the lens is illuminated), Q is an intensity of the light, t is a duration the light is on the lens, $\tau_1$ is a first time machine constant, and $\tau_2$ is a second time machine constant. Each of these variables is empirically determined, and programmed into the ASML stepper. The ASML stepper then adjusts the focus of the stepper according to the above formula to compensate for the heating induced change in the focal length of the lens.

One problem with the above-described compensating method is that it does not account heating induced expansion of the lens due to the variations in the light reflected from the wafer. More specifically, a lighter wafer reflects more light back to the lens than will a darker wafer. The lens will thus be heated more rapidly when the stepper is making an exposure on a lighter wafer than it will when the stepper is making an exposure on a darker wafer. This focus error can result in a blurred pattern being imprinted on the wafer even where the compensation technique described above is used.

Further, steppers have only specific input variables that can be adjusted to determine the focus of the lens. Therefore, even if a magnitude of wafer reflectance were determined, the reflectance could not be programmed into the stepper. For example, the formula discussed above has eight variables, each of which is attributable to a specific characteristic of the stepper machine, it's related components, or functions thereof. The stepper may be programmed with each of these variables and no more. The stepper is incapable of processing additional variables, such as the reflectance of the wafer.

SUMMARY OF THE INVENTION

The present invention provides methods for determining a correction factor for a focus of a lens used to process semiconductor wafers. The correction factor corresponds to the reflectance of a wafer that is within the focus field of the lens. A reflectance of a first wafer is measured, the first wafer being in a first condition. A reflectance of a second wafer is measured, the second wafer being in a second condition. The focus correction factor is calculated corresponding to the first and second reflectances.

DETAILED DESCRIPTION OF THE INVENTION

Figure 3:
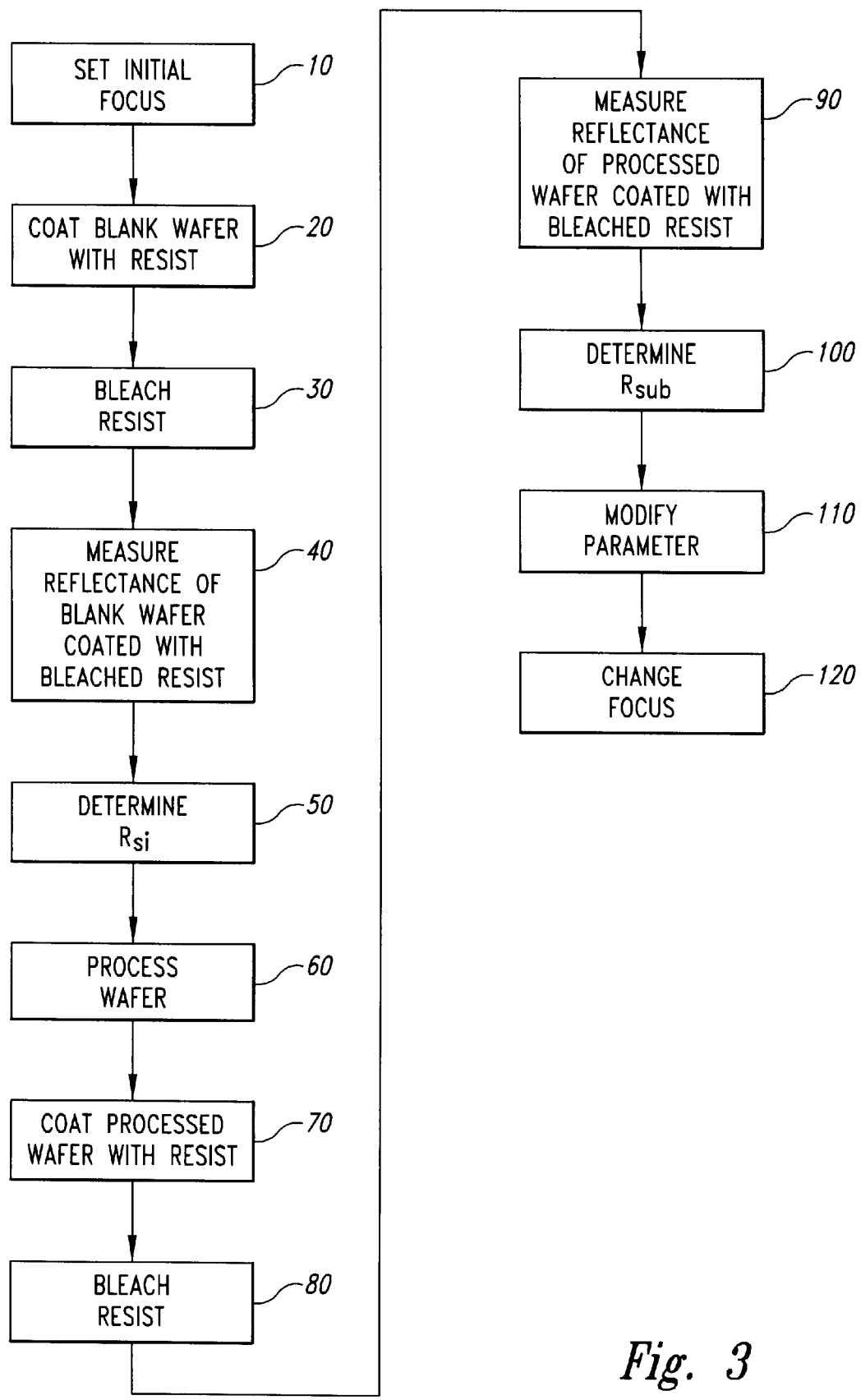
FIG. 3 is a flow chart of a method for compensating for variations in the focus of a prior art stepper according to one embodiment of the invention.

FIG. 3 is a flow chart of one embodiment of a method for compensating for variations in the focus of a lens in a stepper used to process semiconductor wafers. In step 10, an initial focus for the lens is set according to conventional means. Those skilled in the art will recognize various methods exist for setting the initial focus.

In step 20 a "blank" wafer is coated with a resist of the type that will be used during the fabrication of integrated circuits on a wafer. The wafer is "blank" because it does not contain any layers of material disposed over the substrate. The substrate is typically made of essentially pure silicon, or silicon that has been doped with an N-type or P-type material such as phosphorous or boron, respectively.

In step 30 the resist that has been applied to the blank wafer is bleached. The bleaching may be accomplished by any of several ways known to those skilled in the art, typically by exposing the resist to light. As the resist is exposed to the light, its color lightens, becoming more reflective. As explained further below, the reflectance of the blank wafer is used as a baseline to which the reflectance of the wafer after subsequent processing steps is compared. A bleached resist is used to obtain this baseline reflectance value because resist is typically bleached very early during an exposure and is thus in its bleached condition during most of the exposure. Therefore, the reflectance of the wafer coated with the bleached resist closely approximates the average reflectance of the wafer being exposed with an image during processing.

A blank wafer is used to obtain this baseline value because the reflectivity of the wafer will depend on the coverage and reflectivity of materials deposited on the wafer since such materials are visible through the resist. By using a blank wafer, the baseline reflectivity value is independent of a specific pattern of material deposited on the wafer.

Steps 20 and 30 are optional, and may be omitted as appropriate if a wafer in a suitable condition is available. For example, the wafer having a bleached resist may be acquired from another source or created prior in time, thus obviating the need for steps 20 and 30. Similarly, a wafer having a layer of unbleached resist may be acquired, obviating the need for step 20.

In step 40, the reflectance of the blank wafer is measured. The reflectance may be measured by any of several appropriate commercially available devices, such as a Tencor 1050. In one embodiment, the reflectance is measured with light having a wavelength of approximately 248 nm. In another embodiment, the reflectance is measured with light having a wavelength of approximately 365 nm. The light that is applied to wafer may be applied to only a portion of the wafer, or the light may be applied to the entire wafer. Although the measurement may be performed off-line, i.e., by a device other than the stepper, a reflectance measuring device may alternatively be incorporated in the stepper. An advantage of measuring reflectance off-line is that reflectance may be measured during the time that the stepper is processing a wafer whose reflectance was measured earlier.

In step 50, the reflectance of the blank wafer ($R_{si}$) is determined based on the measured reflectance from step 40.

In step 60, a wafer is processed in a conventional manner at one of several stages in the fabrication of integrated circuits. For example, the wafer may be processed in an initial stage at which the blank wafer is oxidized to coat the wafer with silicon dioxide. Alternatively, the wafer may be processed in a subsequent stage in which the wafer is coated with a pattern of material, such as polysilicon or a metal. In any case, the condition of the wafer should be the same as the condition of wafers during processing at the corresponding stage.

In step 70, a coating of resist is applied to the processed wafer.

In step 80, the coating of resist applied to the processed wafer is bleached, as described above.

Steps 70 and 80 are optional, similar to what is described above with regard to steps 20 and 30. Step 70 and/or 80 may be omitted if a wafer in the appropriate condition is available.

In step 90, the reflectance of the processed wafer is measured. The reflectance of the processed wafer is measured similarly to what is described above with respect to step 40, and will not be repeated in the interest of brevity. Again, this measurement is preferably performed off-line, i.e., by a device other than the stepper. The measured reflectance will vary as a function of the reflectance and transmissibility of the resist, as well as the reflectance of the underlying wafer, which is visible through the resist.

In step 100, the reflectance of the processed wafer ($R_{sub}$) is determined based on the measured reflectance from step 90.

In step 110, a first parameter used to determine the focus of the lens used to process semiconductor wafers, such as the lens of a stepper, is modified corresponding to the first and second reflectances $R_{si}$, $R_{sub}$. In one embodiment, the first parameter is multiplied by $0.86(R_{sub}/R_{si})$, although in other embodiments different formulas using $R_{sub}$ and $R_{si}$ may be appropriate. Significantly, no new variable is input to the device that contains the lens (such as a stepper) and focusing device for the lens. Instead, an existing variable that does not normally account for reflectance, such as the reticle transmission value T, is modified to compensate for the heating of the lens due to the light reflected from the wafer being processed. No modifications need to be made to either the software or hardware of the device containing the focusing device for the lens, thus providing a cost efficient means for correcting the focus of the lens.

In step 120, the focus of the lens is adjusted to correspond to the modified first parameter. Thus, the focus of the lens is adjusted to compensate for the reflectance of light from a wafer being processed. This method may be repeated for each processing step of the wafer in which the wafer is coated with a resist and exposed with an image. New reflectances need to be determined for each wafer configuration of substrate and layers of material, as different configurations of wafers will provide varying amounts of reflected light.

Figure 4:
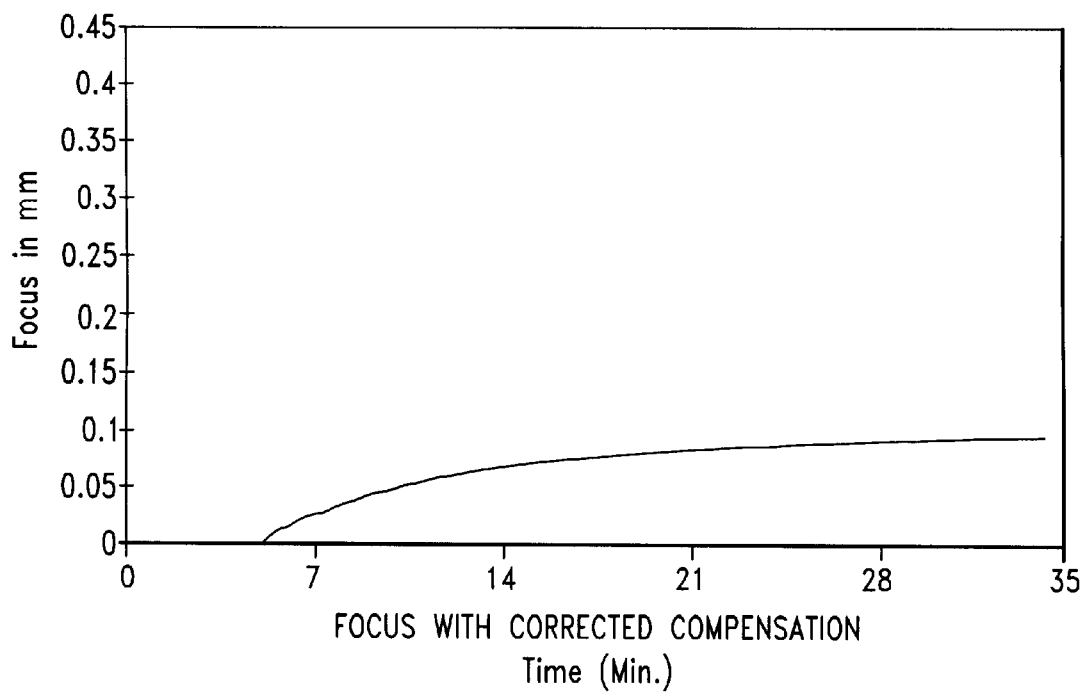
FIG. 4 is a graph of the focus of the stepper compensated for wafer reflectance in accordance with the method of FIG. 3.

FIG. 4 is a graph of the focus of an ASML stepper machine that has been compensated for wafer reflectivity, as described above. In accordance with one embodiment of the invention, the reticle transmission value T is modified by approximately $0.86(R_{sub}/R_{si})$, and applied to the formula for F(inf) described above. Other equations using $R_{sub}$ and $R_{si}$ may be appropriate and other embodiments. No other changes are made to the formula. The original reticle transmission value T used for the wafer being processed is approximately 27.1%. Those skilled in the art will appreciate that the reticle transmission value T may be other values depending on the specific reticle used in the processing device.

Figure 1:
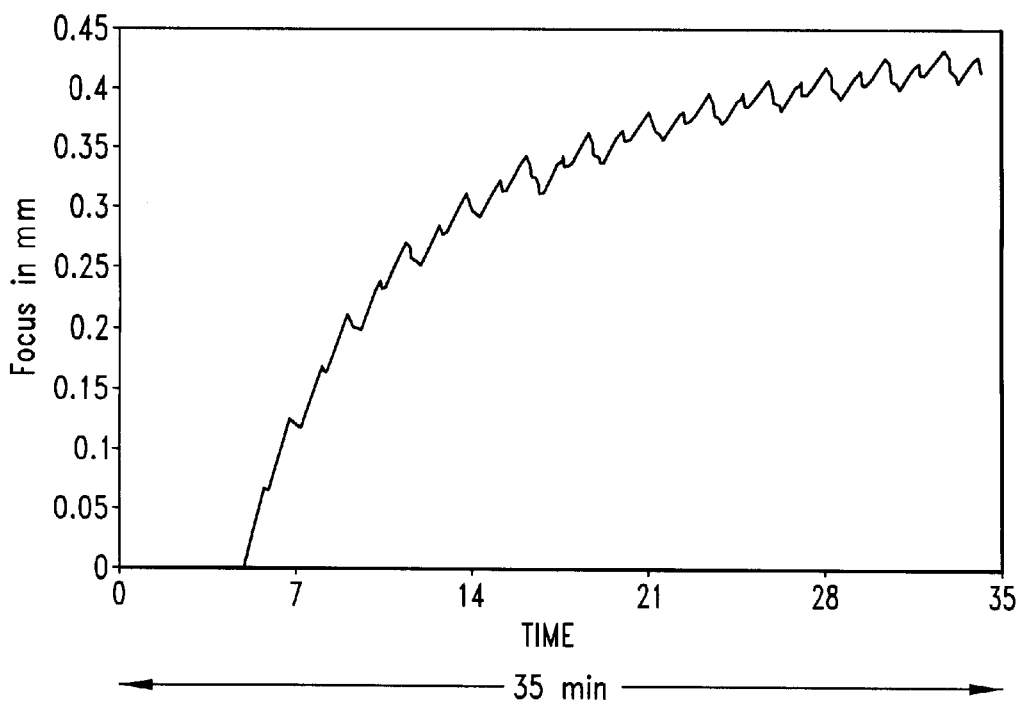
FIG. 1 is a graph of the focus of an ASML stepper machine over time as the lens heats up.
Figure 2:
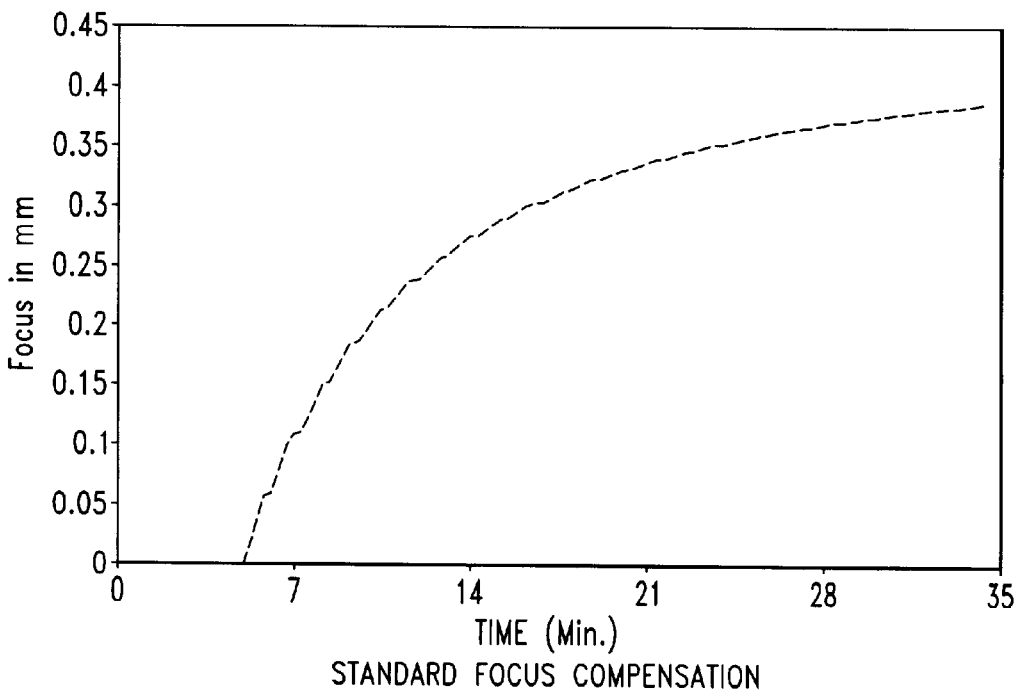
FIG. 2 is a graph of a compensation formula used to compensate for changes in the focus of a prior art stepper as a lens in the stepper heats up.

Using the method described above, $R_{sub}$ and $R_{si}$ are determined to be approximately 0.0493 and 0.1995 respectively for the particular wafers measured. Those skilled in the art will appreciate that different values may be obtained depending on specific wafers and layers of material. Thus, using Equation 1 modified as explained above, a new reticle transmission value T of approximately 6.7% is obtained. Using the new reticle transmission value, the focus of the stepper changes by approximately 0.07 microns over the same time period and number of wafers that the focus of the uncompensated stepper changes by 0.4 microns as explained above with reference to FIGS. 1 and 2.

Figure 5:
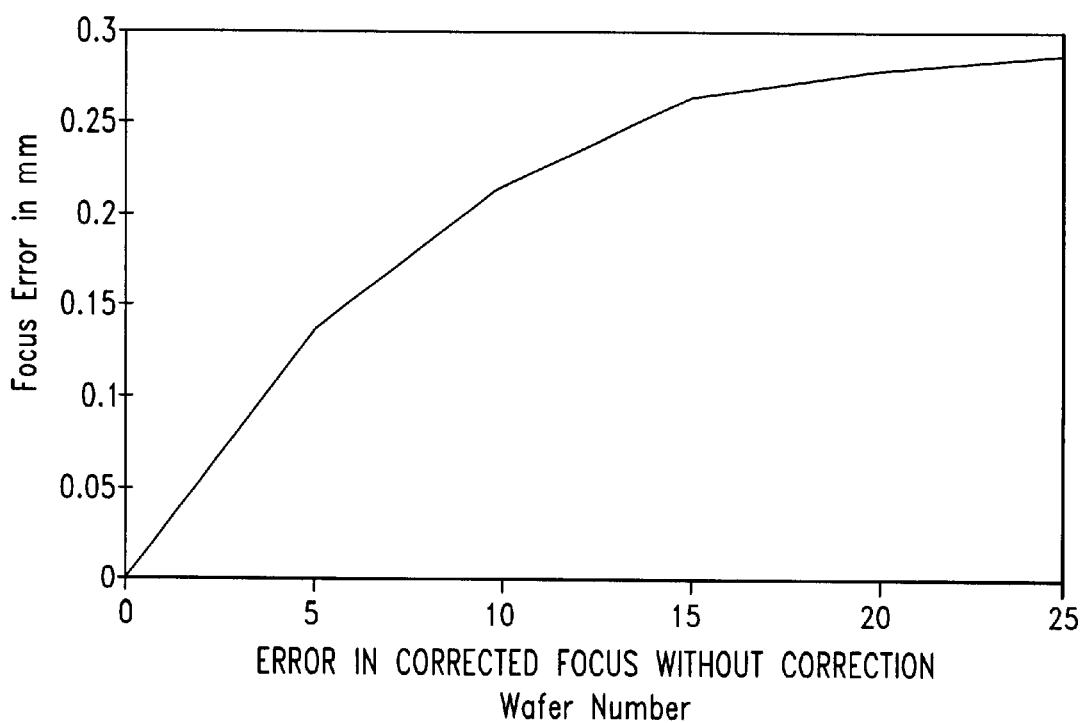
FIG. 5 is a graph of the error in the focus of the stepper without compensations for wafer reflectance.

FIG. 5 is a graph of the focus error of processed wafers using the formula for F(inf) (described above) using the original reticle transmission value T of 27.1%. The focus error is calculated by subtracting the focus using the reticle transmission value T at 6.7% from the focus using the original transmission value of 27.1%. As shown in FIG. 5, the focus error approaches 0.3 microns as the number of wafers processed increases. As discussed above, 0.3 microns is a significant error, and could result in an improper pattern or mask being imprinted on the wafer.

Figure 6:
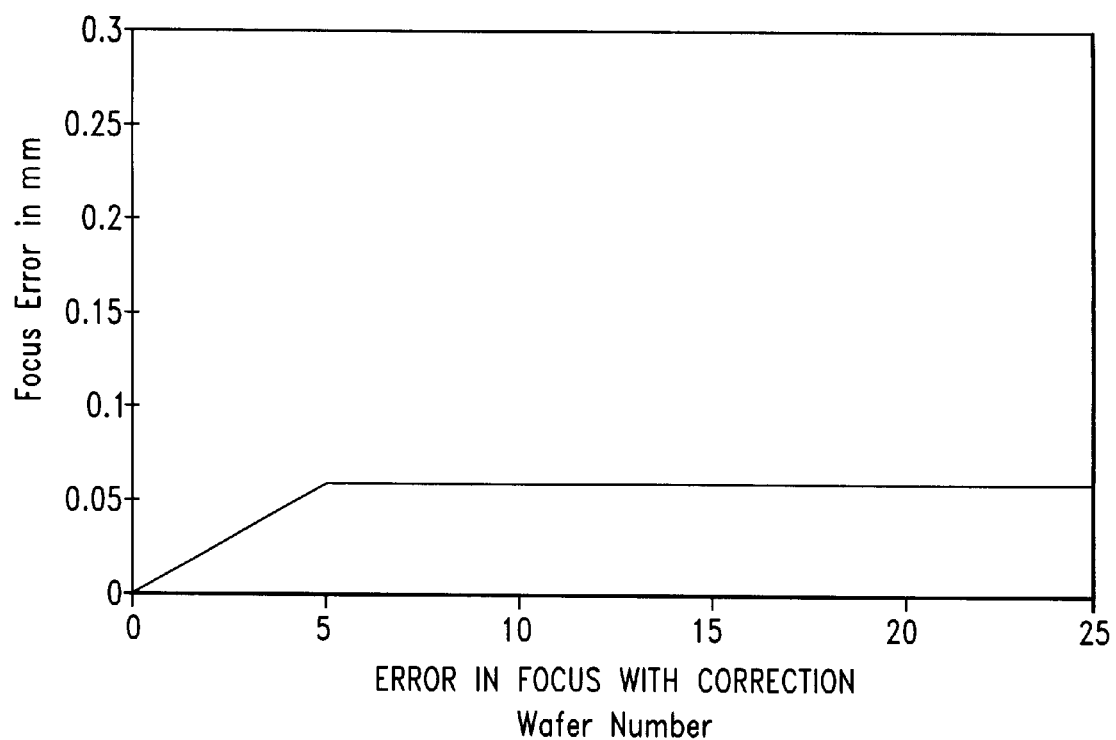
FIG. 6 is a graph of the error in the focus of the stepper compensated for wafer reflectance in accordance with the method of FIG. 3.

FIG. 6 is a graph of the focus error using the reticle transmission value T of 6.7%. Changing the reticle transmission value T from 27.1% to 6.7% changes the focus error from approximately 0.28 microns to 0.06 microns. Those skilled in the art will appreciate that the focus error may vary depending on the specific reticle and wafer being processed. Based on the above, changing the focus to compensate for wafer reflectance improves the lens heating algorithm performance. The focus error with the new reticle transmission value, however, is not zero, and therefore a compensation factor must be included in the formula for determining the new reticle transmission value T.

Experiments with three different reticles determined that an average total reduction of focus errors ΔF is approximately 0.196 microns. The average focus error with new reticle transmission values RF is approximately 0.073 microns. The average difference in reflectance ΔR of the wafer being processed with the different reticles is approximately 0.376. Therefore, the compensation factor Cf=(RF× ΔR)/ΔF. This formula results in the compensation factor of approximately 0.14. Thus, the final formula for adjusting the reticle transmission value T is approximately $0.86(R_{sub}/R_{si})$. Other compensation factors, and therefore other final formulas, may be appropriate for different wafers and reticles. Thus, the adjusted reticle transmission value T may be substituted for the original reticle transmission T in the formula for F(inf) to determine a more accurate focus for the lens described above.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for determining a focus correction factor for a lens used to process semiconductor wafers with a second reflectance, comprising:

measuring a first reflectance of a first semiconductor wafer, the first wafer having a substrate and a resist disposed on the substrate;

measuring a second reflectance of a second semiconductor wafer, the second wafer having a substrate, a material disposed over the substrate, and a resist disposed on the material; and calculating the focus correction factor corresponding to the first and second reflectances by calculating a ratio of the first and second reflectances.

2. The method of claim 1 wherein the ratio comprises the second reflectance divided by the first reflectance and multiplied by a value between 1.0 and a value closely approximate to 0.86.

3. The method of claim 1 wherein measuring the first and second reflectances respectively comprises:

applying a light to each of the first and the second wafers; and measuring the light reflected from each of the first and the second wafers.

4. The method of claim 3 wherein applying the light to each of the first and the second wafers comprises applying the light to only a portion of each of the first and the second wafers.

5. The method of claim 4 wherein the portion of the second wafer to which the light is applied corresponds to the portion of the first wafer to which the light is applied.

6. The method of claim 3 wherein measuring the light comprises measuring the intensity of light reflected from each of the first and the second wafers.

7. The method of claim 3 wherein the light comprises a light having a wavelength of closely approximate to 248 nm.

8. The method of claim 3 wherein the light comprises a light having a wavelength of closely approximate to 365 nm.

9. The method of claim 1 wherein the first and second reflectances are each measured with a photodetector.

10. The method of claim 1 wherein the substrate of the first wafer comprises a first substance having a first composition and the substrate of the second wafer comprises the first substance having the first composition.

11. The method of claim 1 wherein the resist comprises a bleached resist.

12. The method of claim 1 wherein the resist comprises a photo-sensitive material.

13. The method of claim 1 wherein the material disposed over the substrate comprises a first material, and the second wafer further comprises at least one layer of a second material disposed between the substrate and the first material.

14. A method for adjusting a focus of a lens used to process semiconductor wafers in an apparatus that determines the focus based on a first parameter, the first parameter being a parameter other than a parameter that corresponds to the reflectance of an object that is within a focus field of the lens, the method comprising:

measuring a first reflectance of a first semiconductor wafer, the first wafer being a substrate with a resist disposed on the substrate;

measuring a second reflectance of a second semiconductor wafer, the second wafer being a substrate with a material disposed over the substrate, and a resist disposed on the material; and adjusting the first parameter by multiplying the first parameter by a ratio of the first and second reflectances.

15. The method of claim 14 wherein the ratio comprises the second reflectance divided by the first reflectance and multiplied by a value between 1.0 and a value closely approximate to 0.86.

16. The method of claim 14 wherein the first parameter comprises a reticle transmission value.

17. The method of claim 14 wherein measuring the first and second reflectances respectively comprises:
  applying a light to each wafer; and
  measuring the light reflected from each wafer.

18. The method of claim 17 wherein applying the light to each wafer comprises applying the light to only a portion of each wafer.

19. The method of claim 18 wherein the portion of the second wafer to which the light is applied corresponds to the portion of the first wafer to which the light is applied.

20. The method of claim 17 wherein measuring the light comprises measuring the intensity of light reflected from each wafer.

21. The method of claim 17 wherein the light comprises a light having a wavelength of closely approximate to 248 nm.

22. The method of claim 17 wherein the light comprises a light having a wavelength of closely approximate to 365 nm.

23. The method of claim 14 wherein the first and second reflectances are each measured with a photodetector.

24. The method of claim 14 wherein the substrate of the first wafer comprises a first substance having a first composition and the substrate of the second wafer comprises the first substance having the first composition.

25. The method of claim 14 wherein the resist comprises a bleached resist.

26. The method of claim 14 wherein the resist comprises a photo-sensitive material.

27. The method of claim 14 wherein the material disposed over the substrate comprises a first material, and the second wafer further comprises at least one layer of a second material disposed between the substrate and the first material.

28. A method for adjusting a focus of a lens used to process semiconductor wafers in an apparatus that determines the focus based on a reticle transmission value, the method comprising:
  measuring a first reflectance of a first semiconductor wafer, the first wafer having a substrate and a resist disposed on the substrate;
  measuring a second reflectance of a second semiconductor wafer, the second wafer having a substrate, a material disposed over the substrate, and a resist disposed on the material; and
  adjusting the reticle transmission value by multiplying the reticle transmission value by a ratio of the first and second reflectances.

29. The method of claim 28 wherein the ratio comprises the second reflectance divided by the first reflectance and multiplied by a value between 1.0 and a value closely approximate to 0.86.

30. The method of claim 28 wherein measuring the first and second reflectances respectively comprises:
  applying a light to each of the first and the second wafers; and
  measuring the light reflected from each of the first and the second wafers.

31. The method of claim 30 wherein applying the light to each of the first and second wafers comprises applying the light to only a portion of each of the first and second wafers.

32. The method of claim 31 wherein the portion of the second wafer to which the light is applied corresponds to the portion of the first wafer to which the light is applied.

33. The method of claim 30 wherein measuring the light comprises measuring the intensity of light reflected from each wafer.

34. The method of claim 30 wherein the light comprises a light having a wavelength of closely approximate to 248 nm.

35. The method of claim 30 wherein the light comprises a light having a wavelength of closely approximate to 365 nm.

36. The method of claim 28 wherein the first and second reflectances are each measured with a photodetector.

37. The method of claim 28 wherein the substrate of the first wafer comprises a first substance having a first composition and the substrate of the second wafer comprises the first substance having the first composition.

38. The method of claim 28 wherein the resist comprises a bleached resist.

39. The method of claim 28 wherein the resist comprises a photo-sensitive material.

40. The method of claim 28 wherein the material disposed over the substrate comprises a first material, and the second wafer further comprises at least one layer of a second material disposed between the substrate and the first material.

41. A method for adjusting the focus of a lens used to process semiconductor wafers, the method comprising:
  setting an initial focus for the lens;
  applying a light onto a first wafer, the first wafer being a substrate with a resist disposed on the substrate;
  measuring a first reflectance of the light from the first wafer;
  applying the light onto the second wafer, the second wafer being a substrate with a material disposed over the substrate and a resist disposed on the material;
  measuring a second reflectance of the light from the second wafer; and
  setting a final focus for the lens corresponding to the initial focus, wherein the initial focus corresponds to a first reticle transmission value, and the final focus corresponds to a ratio of the second reflectance and the first reflectance multiplied by the first transmission value.

42. The method of claim 41 wherein the first reflectance equals $R_{sub}$, the second reflectance equals $R_{si}$, and the final focus corresponds to a second transmission value of a ratio of between $(R_{sub}/R_{si})$ and approximately $0.86(R_{sub}/R_{si})$ multiplied by the first transmission value.

43. The method of claim 41 wherein applying the light to each wafer comprises applying the light to only a portion of each wafer.

44. The method of claim 43 wherein the portion of the second wafer to which the light is applied corresponds to the portion of the first wafer to which the light is applied.

45. The method of claim 41 wherein measuring the light comprises measuring the intensity of light reflected from each wafer.

46. The method of claim 41 wherein the first and second reflectances are each measured with a photodetector.

47. The method of claim 41 wherein the light comprises a light having a wavelength of closely approximate to 248 nm.

48. The method of claim 41 wherein the light comprises a light having a wavelength of closely approximate to 365 nm.

49. The method of claim 41 wherein the substrate of the first wafer comprises a first substance having a first composition and the substrate of the second wafer comprises the first substance having the first composition.

50. The method of claim 41 wherein the resist comprises a bleached resist.

51. The method of claim 41 wherein the resist comprises a photosensitive material.

52. The method of claim 41 wherein the material disposed over the substrate comprises a first material, and the second wafer further comprises at least one layer of a second material disposed between the substrate and the first material.

53. The method of claim 41 wherein the initial focus is set corresponding to a transmission value of the reticle, a field size, an intensity of the light applied, and a duration of time the light is applied.

54. The method of claim 41 wherein the initial focus is set corresponding to a first transmission value of the reticle and the final focus is set corresponding to a second transmission value of the reticle.

55. The method of claim 41 wherein the final focus varies corresponding to a duration the light is applied.

* * * * *